United States Patent [19]

Carmen

[11] Patent Number: 4,866,382
[45] Date of Patent: Sep. 12, 1989

[54] MAGNETIC ROTARY ENCODER SYSTEM HAVING A MULTI-ELEMENT MAGNETORESISTIVE SENSOR

[75] Inventor: Ralph Carmen, Lebanon, N.J., Peter Campbell, Culver City, CA.

[73] Assignee: Superior Electric Company, Bristol, Conn.

[21] Appl. No.: 117,036

[22] Filed: Nov. 4, 1987

[51] Int. Cl.[4] .................... G01N 7/14; G01R 33/02; H01L 43/08

[52] U.S. Cl. .................... 324/208; 324/252; 338/32 R; 307/309

[58] Field of Search ............... 324/173, 174, 207, 208, 324/252; 307/309; 338/32 R

[56] References Cited

U.S. PATENT DOCUMENTS 4,731,580  3/1988  Indo .................... 324/208

Primary Examiner—Reinhard J. Eisenzopf
Assistant Examiner—Walter E. Snow
Attorney, Agent, or Firm—McCormick, Paulding & Huber

[57] ABSTRACT

A magnetic rotary encoder system includes a magnetoresistive sensor having a magnetoresistive element array which is selectively connected to accommodate a number of different diameter encoder wheels each wheel of which contains a different number of pieces of magnetic information recorded at corresponding different wavelengths. A sensing and conditioning circuit is coupled to the magnetoresistive sensor and detects changes in resistance of the magnetoresistive elements when a magnetic field produced by a magnetic pole causes the magnetoresistive resistance to drop. Output signals are provided in quadrature to increase the resolution of the system.

13 Claims, 5 Drawing Sheets

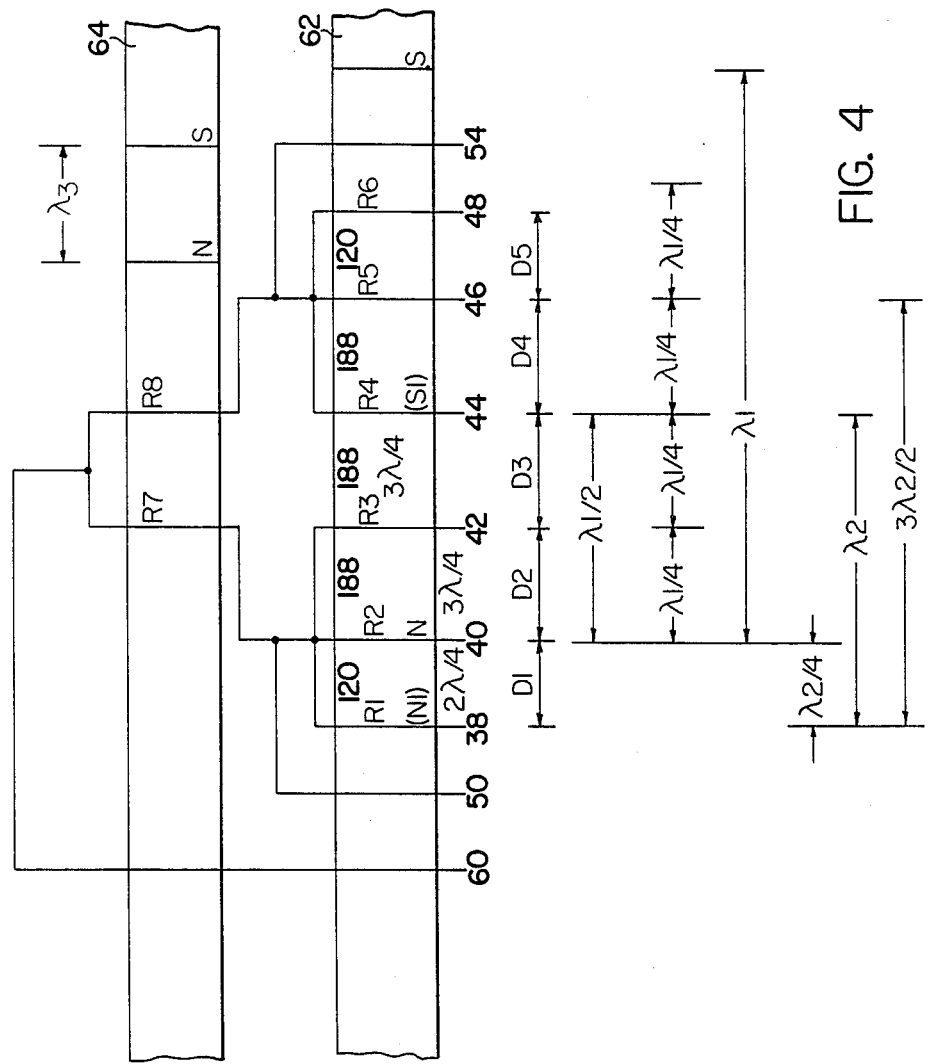

| POLE COUNT / WHEEL DIAMETER | 100 | 128 | 200 | 256 | 360 | 500 | 512 |
|---|---|---|---|---|---|---|---|
| 40.5mm | 318 | 248 | 159 | 124<br>B(3λ/2,λ/4) | 88 | 64<br>A(3λ/4,3λ/2) | 62<br>A(3λ/4,3λ/2) |
| 29.0mm | 228 | 178<br>A(λ/2,λ/4) | 114<br>B(3λ/2,λ/4) | 89 | 63<br>A(3λ/4,3λ/2) | 46 | 44 |
| 24.0mm | 188<br>A(λ/2,λ/4) | 147 | 94 | 74 | 52 | 38 | 37 |

FIG. 5

MAGNETIC ROTARY ENCODER SYSTEM HAVING A MULTI-ELEMENT MAGNETORESISTIVE SENSOR

BACKGROUND OF THE INVENTION

The present invention relates generally to a position encoder system for sensing and encoding the position of a moving member, and relates more particularly to a magnetic rotary encoder system having a magnetic sensor and an encoder wheel wherein the magnetic sensor includes magnetoresistive (MR) elements arranged to sense plural pieces of magnetic information recorded on the encoder wheel and which wheel may have one of a number of different diameters wherein each diameter wheel may contain a different number of pieces of magnetic information recorded thereon at an associated different spacing.

It is well known in the art that when a MR element made of a MR material such a permalloy is placed in a magnetic field and current is supplied to the element, the resistance value of the MR element varies depending upon the intensity of the magnetic field. Thus, when such a MR element is used in place of a magnetic head to sense magnetic information recorded on a magnetic recording medium, the recorded magnetic information can be reliably sensed even when the relative velocity between the magnetic recording medium and the MR element is zero, that is, even in a stopped condition of the magnetic recording medium.

It is also known in the art to use the principle of MR resistance value change due to the presence of a magnetic field to sense the velocity, including direction, of rotation or angular position of rotation of a rotating body carrying magnetic information and moving in proximity to the MR element. A transducer apparatus using the principle of the detection of the resistance value of a MR element in the presence of a magnetic field to detect the relative displacement of a magnetic information carrying medium is disclosed, for example, in U.S. Pat. No. 4,039,936 issued Aug. 2, 1977 to A. L. Jones, et al., U.S. Pat. No. 4,403,187 issued Sept. 6, 1983 to Takahashi, et al., U.S. Pat. No. 4,628,259 issued Dec. 9, 1986 to Takahashi, et al., and U.S. Pat. No. 4,639,807 issued Jan. 27, 1987 to Sekizawa, et al. .

It is also known in the art to record serial pieces of magnetic information on a circumferential track provided on the surface of a drum-like rotary magnetic recording medium with the MR elements of the sensor disposed to extend transverse to the circumferential direction of movement of the magnetic recording medium with the sensor being brought into close proximity and opposite to the magnetic information recorded on the magnetic recording medium. The serial pieces of magnetic information are generally recorded as north(N) and south(S) poles on the circumferential face surface of the recording medium with the spacing between the poles, also referred to as wavelength ($\tau$), being relatively small to achieve a high recording density and accordingly, to read the recorded information with a higher resolution during movement of the recording medium. Since only a finite number of poles may be recorded on a recording medium, such as an encoder wheel, a predetermined and generally limited number of pulses can be produced. It has been found that the resolution is improved by using a sensor having a plurality of MR elements arranged in a relatively phase shifted relation. That is, the MR elements are spaced apart from one another by a predetermined distance and in accordance with the spacing of the magnetic information recorded on the magnetic recording medium. As the spacing between each piece of recorded information on the magnetic recording medium is made smaller to increase the number of pieces of information and accordingly the number of output pulses to improve the resolution or sensor sensitivity, the spacing between successive MR elements must also be made smaller to accommodate the smaller spacing between each piece of recorded information. Therefore, a number of different sensors each having a different MR element spacing to accommodate a specific corresponding spacing of recorded information on a magnetic recording medium, such as, an encoder wheel, are required. Consequently it is necessary to keep a large inventory of different diameter encoder wheels of which each diameter may have a different number of pieces of recorded magnetic information and a corresponding different sensor for each of the different encoder wheels. Accordingly, it would be desirable to be able to use a single sensor to sense a number of different diameter encoder wheels each having a different number of pieces of magnetic information recorded at a number of predetermined distances from one another whereby the incremental movement of the encoder wheel can be detected with a high degree of accuracy.

In addition to sensing the incremental movement of an encoder wheel it is often desirable to be able to determine the absolute displacement of a moving member, for example, the number of rotations of a shaft of an electric motor or other apparatus to which the encoder wheel is coupled. Accordingly, it is also desirable to use the same magnetoresistive sensor to sense magnetic information recorded on the magnetic recording medium, such as, for example, on an index track of an encoder wheel wherein the magnetic information is recorded along an index track on the circumferential face surface of the wheel. A single magnetic sensor for sensing magnetic incremental and index information recorded on different diameter encoder wheels is disclosed in a copending application, Ser. No. 117,035, filed concurrently herewith and assigned to the same assignee as the present invention, and entitled Magnetic Sensor Having Magnetoresistive Elements.

It is an object of the present invention therefore, to provide a magnetic rotary encoder system that uses a single MR sensor having a MR element array that may be used with a number of different diameter encoder wheels of which each diameter wheel may have a different number of pieces of magnetic information recorded at corresponding different spacings frrom one another and along an incremental track on the circumferential face of the wheel.

It is a further object of the present invention to provide a magnetic rotary encoder system in which the single MR sensor includes an additional array having MR elements arranged to sense magnetic information recorded on an index track on the circumferential face of the encoder wheel being sensed.

It is yet a further object of the present invention to provide a magnetic rotary encoder system that is unaffected by dirt or other contaminants and that is temperature stable and substantially free from shock or vibration damage.

SUMMARY OF THE INVENTION

In accordance with the present invention, a magnetic rotary encoder system for encoding the position of a rotating member is disclosed wherein an encoder wheel may have one of a number of different diameters and of which each diameter wheel may have one of a different number of predetermined pieces of magnetic information recorded along a circumferentially running track on the circumferential face surface of the wheel from which incremental and directional movement of the wheel is determined. A magnetoresistive (MR) displacement sensor is positioned adjacently opposite and in close proximity to the circumferential face surface of the wheel. The MR sensor includes an MR element array for sensing the magnetic information recorded on the wheel. The element array is coupled to connection means which are provided for selectively connecting predetermined ones of the elements in an interleaved arrangement to provide a predetermined MR element spacing corresponding to the spacing of the magnetic information recorded on an associated encoder wheel with which it works. The selectively connected MR elements form a bridge circuit which is connected to a pair of comparator circuits which generate output voltage signals in response to a change of resistance of an MR element when the element is in the presence of a magnetic field generated by the recorded incremental magnetic information.

The invention also resides in the encoder wheel having a second circumferentially running track on the circumferential face surface of the wheel wherein magnetic information representative of the index position of the wheel is recorded at a predetermined spacing. The MR sensor includes a second MR element array for sensing the index magnetic information and which elements are coupled to circuit means for generating an output voltage in response to a change of resistance when the MR elements in the index array are in the presence of a magnetic field generated by the recorded index magnetic information.

BRIEF DESCRIPTION OF THE DRAWINGS

Additional objects, features and advantages of the present invention will become readily apparent from the following description and claims taken in conjunction with the accompanying drawings wherein:

FIG. 4 schematically shows the MR elements associated with the incremental array of MR elements and the index array of MR elements together with a schematic representation of a magnetic recording medium used in connection therewith.

FIG. 5 illustrates a selection chart defining the relationship between a number of predetermined encoder wheel diameters and desired pole counts and a corresponding MR element connection arrangement to be made on the sensor to sense and detect the magnetic information recorded on the encoder wheel.

DETAILED DESCRIPTION OF THE PREFERRED EMBODIMENTS

Figure 1:
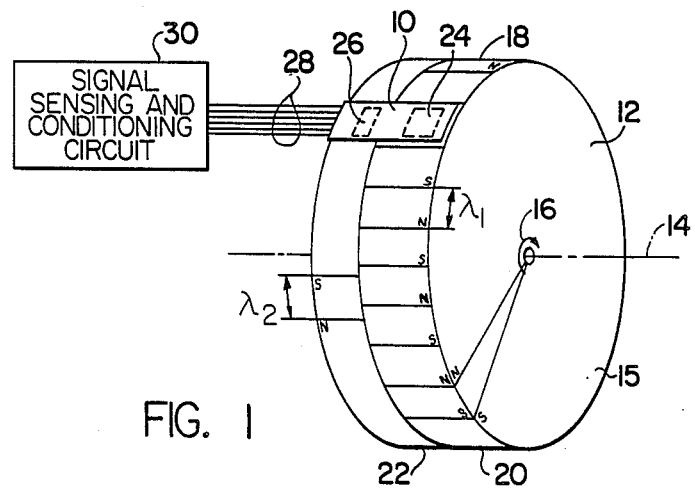
FIG. 1 is a somewhat schematic view of the magnetic rotary encoder system embodying the present invention showing an encoder wheel having magnetic information recorded on incremental and index tracks, respectively and a MR displacement sensor and associated electric circuitry for sensing movement and encoding the position of the wheel.

Turning now to the drawings and considering FIG. 1 in particular, the magnetic rotary encoder system embodying the present invention is shown schematically wherein a magnetoresistive displacement sensor 10 is located in close proximity to a rotary encoder wheel 12 having magnetic information recorded thereon and which information is to be sensed by the sensor 10. The encoder wheel 12 rotates about an axis 14 in a direction indicated generally by the arrow 16. Magnetic information is recorded on the circumferential face surface 18 of the wheel 12 on one or more circumferentially running tracks, in FIG. 1 indicated at 20,22. The encoder wheel 12 may be made of a suitable magnetic material including a moldable magnetic plastic material such as Telsan which is a trademark of Sawafuji America Corp. By way of example, in FIG. 1, track 20 includes magnetic information recorded in the form of north(N) and south(S) magnetic poles at a spacing or wavelength designated $\tau_1$. The magnetic information is sensed and generally used to detect incremental movement of the encoder wheel 12. The wavelength of the directly recorded magnetic information is chosen as discussed in connection with FIG. 5 to produce a desired number of pulses or pole count per revolution for an encoder wheel having a given diameter to provide a desired resolution in accordance with a specific application. The magnetic information recorded on the encoder wheel 12 is sensed by a MR element pattern array enclosed within the dotted lines shown generally at 24 and which MR element pattern appears on the surface of the sensor 10 closest to the circumferential face surface 18 of the encoder wheel 12.

In some applications it is desirable to determine the absolute position, that is, the number of revolutions of the encoder wheel 12 from a starting position and accordingly, a shaft or other rotating member to which the encoder wheel 12 is attached. The number of revolutions of the encoder wheel 12 may be determined by sensing magnetic information recorded on the circumferential face surface 18 along an index track 22 wherein the magnetic information is recorded at a spacing or wavelength $\tau_2$. The index magnetic information is sensed by an MR element pattern array indicated generally within the dotted lines 26. Again, the index MR element pattern array appears on the surface of the sensor 10 closest to the face surface 18 of the encoder wheel 12.

The sensor 10 is electrically coupled by an electrical conduit generally shown at 28 to a signal sensing and conditioning circuit shown generally within the function block at 30. The electrical conduit 28 may be of any well known type, such as, for example, a flat ribbon, flexible, multiple conductor conduit, or elastomeric (zebra strip) connection. The conduit 28 facilitates electrical connection to the output terminations of the sensor 10 which is relatively minaturized and thereby allowing through a suitable fixturing arrangement, positioning of the sensor in close proximity to the circumferential face surface 18 of the encoder wheel 12.

It is also possible to record magnetic information on the radial surface 15 of the encoder wheel 12 and to locate a magnetoresistive sensor in close proximity thereto, the arrangement may not be preferable in some instances since the spacing between the radial surface of the wheel and the sensor may not be stable due to lateral movement of the wheel toward and away from the sensor as the shaft attached to the encoder wheel moves laterally. Lateral movement of the encoder wheel away from the sensor generally reduces the sensitivity of the MR sensor and affects the amplitude of an output detection signal derived from a MR element. Typically, a MR element exhibits only a two to three percent change of resistance when brought into the influence of a magnetic field. Accordingly, increasing or varying the spacing between the magnetic information and the sensor could substantially reduce or affect the detected signal amplitude. In general, the arrangement illustrated in FIG. 1 avoids the problem of lateral run out. In the absence of lateral run out, the system of the present invention works equally well with magnetic information recorded on the radial surface 15. Additionally, since the encoder wheel can be produced with a high degree of accuracy, variations in the spacing between the circumferential face or radial surface of the encoder wheel and the sensor as the encoder wheel rotates are substantially eliminated due to encoder wheel tolerances. Consequently, substantially the same amplitude output detection signal is produced at all positions of the encoder wheel 12 relative to the sensor 10 during the rotation of the wheel about the axis 14.

Figure 2:
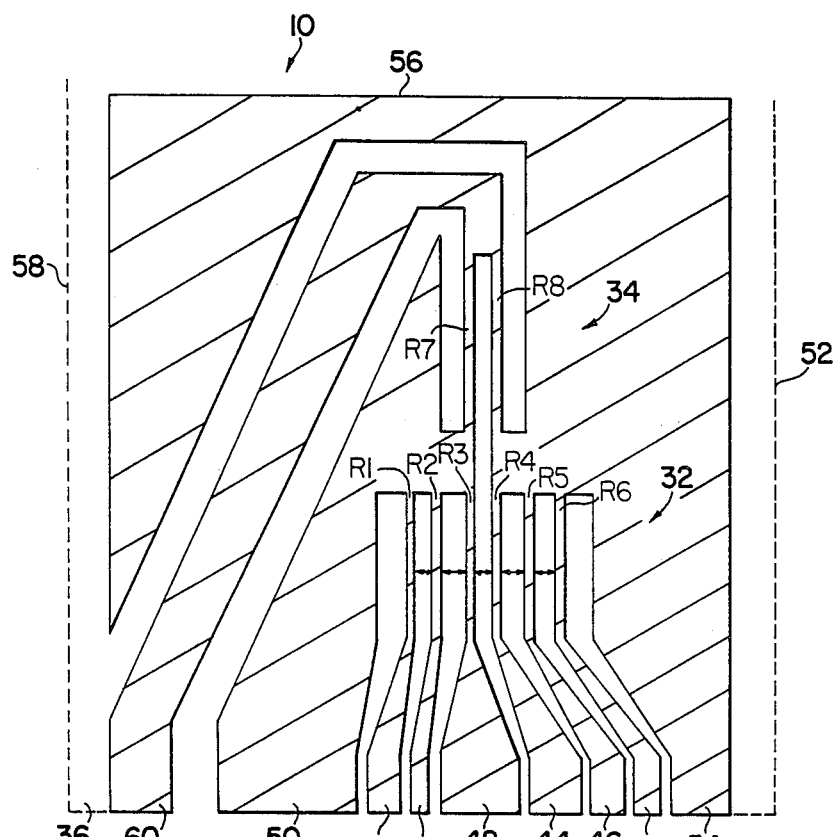
FIG. 2 schematically shows the construction of a MR displacement sensor having incremental and index MR element arrays for sensing magnetic information recorded on an encoder wheel and which may be used with the magnetic rotary encoder system of the present invention.

Turning now to FIG. 2, the sensor 10 used with the present invention is shown schematically therein and illustrates a MR element arrangement to sense magnetic information recorded on an incremental information track and index information track of an encoder wheel used in conjunction with the sensor. The MR element arrangement permits the sensor to be used with a number of different diameter encoder wheels wherein each different diameter wheel may contain a different number of pieces of magnetic information each recorded at different spacing or wavelengths.

Briefly the sensor 10 comprises a first magnetoresistve element pattern array generally indicated 32 for detection of magnetic information recorded on an associated incremental information track and a second MR element pattern array designated generally 34 for detection of magnetic information recorded on an associated index information track of an associated encoder wheel.

The MR elements in the pattern 32 are designated R1, R2, R3, R4, R5, and R6 respectively, and are arranged to form the resistive elements of a plurality of differential bridge circuits and which resistive elements are interconnected in a predetermined manner in accordance with the wavelength and diameter of an associated encoder wheel with which the sensor is used. Each of the MR elements R1-R6 extend in the longitudinal direction and have one end connected to a respective output terminal 38,40,42,44,46 and 48, respectively. The respective ends of MR elements R1, R2, and R3, opposite the output terminal ends are connected in common and extend for a short distance transverse to the longitudinal direction of the MR elements R1-R3 and around the outermost side of MR element R1 to a position adjacent the output terminal 38 associated with MR element R1 and forms a first power supply connection terminal 50. The respective ends of MR elements R4, R5 and R6 opposite to their output terminal ends are also connected in common and extend to a position adjacent the output terminal 48 and forms a second power supply connection terminal 54. The widths of the terminals 38 to 48, 50 and 54 are substantially wider than the width of the MR elements R1-R8 to minimize the influence of other recorded magnetic information on the encoder wheel thereby substantially reducing the possibility of inducing erroneous or degraded sensed signals.

The second MR element pattern 34 includes MR elements R7 and R8 wherein one end of MR element R7 is connected to terminal 50 and one end of MR element R8 is connected to terminal 54 and the respective opposite ends of MR elements R7 and R8 are connected in common and extend to a position adjacent terminals 38 to 48, 50 and 54 to form an index output connection terminal 60. The width of terminal 60 is substantially wider than the width of the MR elements R1-R8 to minimize any possible influence of other recorded magnetic information on the encoder wheel which may cause erroneous or degraded sensed signals. For further details of the magnetoresistive sensor, reference may be made to a copending application filed concurrently herewith and assigned to the same assignee as the present invention and entitled Magnetic Sensor Having Megnetoresistive Elements Ser. No. 117,035 and which disclosure is incorporated herein by reference.

Figure 3:
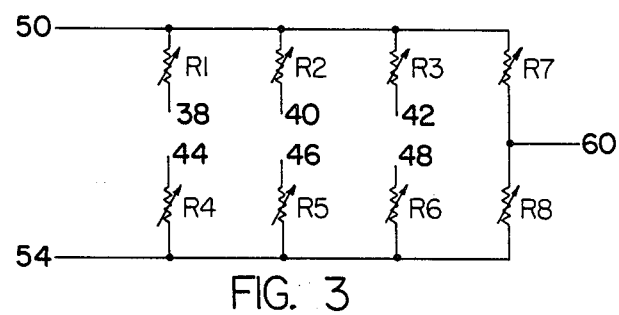
FIG. 3 is a circuit diagram showing the MR elements of the sensor which may be selectively connected in an interleaved fashion to form an associated bridge circuit corresponding to the wavelength $\tau$ of magnetic information recorded on a magnetic recording medium and to be sensed by the sensor.

Considering now FIGS. 3 and 4, the sensor of the present invention is shown schematically wherein the magnetoresistive elements R1-R8 comprising the incremental and index groups of MR elements, respectively are shown in relation to an associated recording medium upon which magnetic information is recorded on an incremental track 62 and an index track 64. FIG. 3 illustrates schematically the magnetoresistive elements R1-R6 of the sensor which may be selectively connected in a predetermined interleaved fashion to form a number of associated differential bridge circuits each corresponding to a given wavelength $\tau$ of the magnetic information recorded on the magnetic recording medium. The schematic representation of the MR elements R1-R8 and the respective external power supply connection terminals 50 and 54 and the index terminal 60 correspond to the construction of the sensor as described above in conjunction with FIG. 2.

As illustrated in FIG. 4, the spacing between the MR elements is predetermined and is related to the spacing of the magnetic information on the magnetic recording medium. In FIG. 4 the spacing between MR elements R1 and R2 is equal to a distance D1; the spacing between MR elements R2 and R3 is equal to a distance D1; the spacing between MR elements R4 and R5 is equal to a distance D4, and the spacing between MR elements R5 and R6 is equal to a distance D5. The spacing between the two groups comprising MR elements R1-R3 and MR elements R4-R6 is equal to the spacing D3 which is also the spacing between MR elements R3 and R4. In the preferred embodiment, the spacing D1 is equal to the spacing D5. The spacing between MR elements as represented by D2, D3 and D4 are also equal to one another.

As can be seen from the MR element arrangement shown in FIG. 3, a corresponding differential bridge configuration may be made for each of a number of different wavelength magnetic information. For example, in FIG. 4 the magnetic recorded information represented by the wavelength $\tau_1$ would be detected by a bridge configuration in which Mr elements R2 and R4 are connected in an interleaved fashion via terminals 40 and 44 to form one bridge output terminal and the MR elements R3 and R5 are connected in an interleaved fashion via terminals 42 and 46 to form a second bridge output terminal. Accordingly, the spacing between the MR elements of each of the two different groups, that is, between the MR elements of a pair of elements of the groups, pair R2 and R4 and pair R3 and R5, is spaced at a distance equal to $\tau 1/2$ in accordance with well known sensing techniques. Furthermore, the spacing between the respective MR elements in each respective group associated with the sensing of the magnetic information having a wavelength $\tau_1$ are separated from one another by a distance equal to $\tau 1/4$ with the spacing between groups being $\tau/4_1$, that is, the spacing between the pairs R2 and R4 and R3 and R5.

As discussed above, the sensor used in the rotary encoder system may be configured to sense magnetic information recorded at different wavelengths. For example, as illustrated in FIG. 4, a wavelength equal to $\tau_2$ would be sensed by the groups of elements comprising MR element R1 connected in an interleaved fashion with MR element R5 via terminals 38 and 46, respectively to form one bridge output terminal wherein the spacing between the MR elements of the pair R1 and R5 is an odd multiple of $\tau/2_2$, that is, n $\tau/2_2$ where n=1,3,5 ... m. Additionally, the group of elements comprising MR elements R2 and R6 is connected in an interleaved fashion with MR element R2 being connected to R6 via terminals 40 and 48 to form a second bridge output terminal wherein the spacing between MR elements of the pair R2 and R6 is an odd multiple of $\tau/2_2$, that is, n $\tau/2_2$ where n=1,3,5 ... m.

As also illustrated in FIG. 4, the wavelength of magnetic information representative of index information recorded on the index track 64 is shown as $_3$ and which information is sensed by the MR elements R7 and R8 to provide an output index signal at terminal 60 as further explained below.

Figure 6:
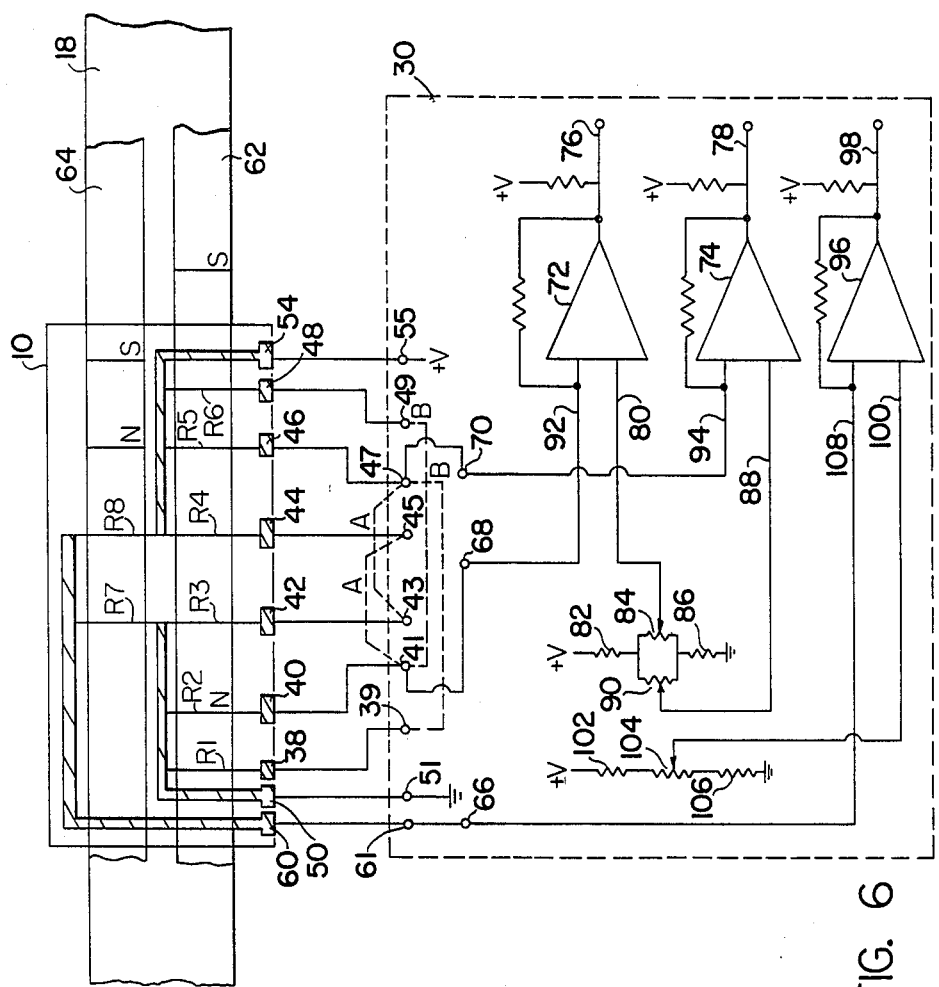
FIG. 6 is a schematic representation of the MR displacement sensor and the signal and conditioning circuit of the present invention.

Applicant has found that the majority of users desire a typical number of pulses per revolution m of an encoder wheel for example, 100, 128, 200, 256, 360, 500 and 512. Additionally, the pulse count per revolution may be increased by providing output signals in quadrature thereby providing directional information and poviding transitional reference points at a frequency equal to four times the pulse count, that is, for the above numbers from 400 to 2048 reference transitions. Applicant has in the above-identifed copending patent application disclosed a magnetoresistive sensor wherein the center-to-center spacing between MR elements R1 and R2 and R5 and R6 respectively is 120 microns and the spacing between MR elements R2 and R3, R3 and R4, and R5 and R6 is 188 microns as illustrated in FIGS. 4 and 6. Applicant has developed as illustrated in FIG. 5, the required MR element connections to form the differential bridge circuits to detect and sense magnetic information recorded on three different diameter d encoder wheels to produce a desired number of pulses per revolution wherein the number contained at the intersection of the pulse count and wheel diameter is representative of the quarter wavelength spacing in microns. For example, an encoder wheel having a diameter of 40.5 millimeters has a circumference equal to 127,234 microns and dividing by the number of poles, n this case, 100, the wavelength $\tau$ is equal to 1,272 microns and a quarter wavelength is therefore equal to 318 microns. Calculating in a similar manner for each of the encoder wheel diameters d 40.5 millimeter, 29 millimeter and 24 millimeter for the specified pole counts m, the quarter wavelength is determined in microns for each of the possible combinations. Although FIG. 5 illustrates the spacing for three different diameter encoder wheels, it will be recognized that different pole counts and different diameter encoder wheels from those shown may be used with the system of the present invention.

It can be seen from FIG. 5, that the encoder wheel diameter to produce a pole count equal to 100 using the above-referenced MR sensor is 24 millimeters. As shown, a quarter wavelength is equal to 188 microns and referring to FIG. 6, the sensor 10 is figured for the "A" connection by connecting terminals 41 to 45 and terminals 43 to 47 respectively on the circuit means 30. This effectively connects MR element R2 to MR element R4 and MR element R3 to MR element R5. As stated above, the spacing between elements of a sensor pair is an odd multiple of $\tau/2$ and in the present illustration is equal to 396 microns which is the sum of the spacing between elements R2 and R3 and R3 and R4. Likewise, the spacing between elements R3 and R4 and R4 and R5 is equal to 396 microns. The spacing between pairs of sensors is equal to a quarter wavelength and in this case 188 microns.

In a similar manner, from the chart of FIG. 5 it is seen that for a 200 pole count an encoder wheel diameter of 39 millimeters requires a wavelength that may be detected and sensed with the MR sensor 10 using the "B" connection. In this case, the "B" connection requires that terminal 39 be connected to terminal 47 essentially connecting MR element R1 to MR element R5 and connecting terminal 41 to terminal 49 effectively connecting MR element R2 to MR element R6. The spacing between the elements of a pair can be spaced as stated above at an odd multiple of $\tau/2$ which in the present illustration is equal to 684 microns. It is seen that the distance between the MR element R1 and MR element R5 is equal to the sum of the distances between elements R1 and R2 and R2 and R3 and R3 and R4 and R4 and R5 or 684 microns. Additionally, the spacing between the element pairs, that is, between MR element R1 and MR element R2 is a quarter wavelength and in the instant case 114 microns which is obtainable by using the spacing of 120 microns between the elements R1 and R2. Although the spacing does not identically match that of a quarter wavelength its error is less than 5% which is well within accepted industry tolerance wherein optical systems having up to 30% error are utilized.

It can be seen from FIGS. 5 and 6 that a desired pole count can be obtained by choosing the proper encoder wheel diameter and connection arrangement for the sensor 10.

The signal sensing and conditioning circuit 30 includes comparators 72 and 74 for producing an output voltage signal at its output terminal 76,78 respectively each time a magnetic pole is sensed by a corresponding MR element sensor. In FIG. 6, comparator 72 has one input 80 coupled to a voltage divider network comprising resistors 82, variable resistor 84, and resistor 86 to establish a reference voltage at its input. Comparator 74 likewise has one input 88 coupled to a voltage divider network comprising resistor 82, variable resistor 90 and resistor 86 to establish a voltage reference at its input 88. Comparator 72 has its other input 92 connected to a terminal 68 which is coupled to terminal 41 and accordingly the sensor 10. Likewise, the comparator 72 has an input 94 coupled to a terminal 70 which is connected to terminal 47 and accordingly the sensor 10. The operation of the comparators is well known in the art and it is sufficient for the present disclosure to note that when a magnetic pole carried by an encoder wheel is detected by a corresponding MR element, the resistance of the MR element decreases causing the corresponding comparator to change the state of its output signal. As the magnetic pole moves away from the corresponding MR element its resistance increases thereby increasing the voltage at the input to the comparator above the reference voltage set causing its output to again change state. It can be seen that the outputs of comprarators 72 and 74 change out of phase consequently providing a quadrature signal which may be counted to determine incremental movement of the encoder wheel. Also, since the output signals are out of phase, it is possible to determine the direction of movement of the encoder wheel and which determination is well known to those skilled in the art.

The signal sensing and conditioning circuit 30 also includes a comparator 96 for producing a voltage signal at its output 98 representative of sensing the index magnetic information carried on track 64 carried on the surface 18 of the encoder wheel. The comparator 96 has one input 100 connected to a voltage divider circuit comprising resistors 102, variable resistor 104 and resistor 106 to establish a reference voltage at the input 100. The other input 108 of the comparator 96 is connected to terminal 66 which is connected to terminal 51 and accordingly the index output connection terminal 50 of the sensor 10. When both magnetic poles representative of the index information are coincident with the MR elements R7 and R8, a low resistance condition exists and the reference voltage applied to the input 100 is set at one half the + voltage magnitude. When the encoder wheel moves from this position the voltage increase at the comparator input 108 causing the comparator to produce an output pulse representative of the index mark which is used as a once per revolution signal.

A magnetic rotary encoder system has been described above wherein a single magnetoresistive sensor is used with a number of different diameter encoder wheels each wheel having a different number of pieces of magnetic information recorded on the circumferential face of the encoder wheel. It will be recognized that numerous changes and modifications may be made by those skilled in the art without departing from the spirit and scope of the invention. Accordingly, the present invention has been described by way of illustration rather than limitation.

I claim:

1. A magnetic rotary encoder system for encoding the position of a rotating member, said system comprising:

an encoder wheel having one of a number of different diameters d and at least a first circumferentially running track wherein plural pieces of magnetic information representative of incremental positioning of said encoder wheel are recorded at predetermined spaced intervals along the first track to produce a desired pole count of a number of predetermined possible pole counts;

a magnetoresistive displacement sensor disposed adjacently opposite to and in close proximity with the circumferentially running track of said encoder wheel, said sensor being arranged with an arraya of magnetoresistive elements on a non-magnetic substrate and facing said track for sensing the magnetic information recorded on said track, each of said elements in said array having means extending on said substrate to an associated output terminal for selective connection to an electrical conduit wherein said conduit provides electrical connection means between said sensor and a circuit means comprising said system;

means for selectively connecting said magnetoresistive elements of said sensor in an interleaved arrangement to provide a corresponding predetermined element spacing in accordance with one of a number of predetermined connecting arrangements each of which correspond to an encoder wheel having a given diameter and pole count, said selectively connected elements providing at least a one pair of bridge terminals;

said circuit means having first means for selective coupling to one of said at least one pair of bridge terminals and said circuit means generating an output signal representative of the incremental position of said encoder wheel in response to a change in resistance of said selectively connected elements in the presence of a magnetic field generated by said recorded magnetic information on said encoder wheel.

2. A magnetic rotary encoder system as defined in claim 1 further comprising said encoder wheel having a second circumferentially running track wherein a piece of magnetic information representative of the index position of said encoder wheel is recorded, said sensor having a second array of magnetoresistive elements on the non-magnetic substrate, said MR elements of said second array having the same orientation as said MR elements of said first array and being disposed substantially opposite said first array for sensing the magnetic information recorded on said index track, said MR elements in said first array having output terminal means and providing a second pair of bridge terminals for connecting to said electrical conduit and said circuit means via said conduit, said circuit means having second means for selective coupling to said output terminal means comprising said second pair of bridge terminals and producing an index output signal in response to a change in resistance of said index MR elements.

3. A magnetic rotary encoder system as defined in claim 1 wherein said first circumferentially running track is located on the circumferential face surface of the encoder wheel.

4. A magnetic rotary encoder system as defined in claim 1 wherein said first circumferentially running track is located on the radial face surfaee of the encoder wheel.

5. A magnetic rotary encoder system as defined in claim 2 wherein said second circumferentially running track is located on the circumferential face surface of the encoder wheel.

6. A magnetic rotary encoder system as defined in claim 2 wherein said second circumferentially running track is located on the radial face surface of the encoder wheel.

7. A magnetic rotary encoder system as defined in claim 1 wherein said number of predetermined pole counts m includes pole counts in the set comprised of 100, 128, 200, 256, 360, 500 and 512.

8. A magnetic rotary encoder system as defined in claim 1 wherein said encoder wheel diameter d includes diameters of 24.0 mm, 29.0 mm and 40.5 mm.

9. A magnetic rotary encoder system as defined in claim 1 wherein said selectively connecting means includes connecting two of said MR elements in a first pair of sensors and a different two of said MR elements in a second pair of sensors, said MR elements in said first and second pairs being connected in an interleaved fashion with the MR elements of each pair being spaced at distance equal to an odd multiple of n $\tau/2$ where n=1,3,5—m and the spacing between an MR element of said first pair and an MR element of said second pair being spaced at a distance equal to an odd multiple of n $\tau/2$ where n=1,3,5—m.

10. A magnetic rotary encoder system as defined in claim 2 further characterized by means for selecting one and the other and both of said at least one pair of bridge terminals carrying said incremental output signal representative of the incremental positioning of said wheel and for selecting said second pair of bridge terminals carrying said index output signal representative of the index position of said wheel.

11. A magnetic rotary encoder system as defined in claim 1 wherein said encoder wheel is made of a moldable magnetic material.

12. A magnetic rotary encoder system as defined in claim 11 wherein said moldable magnetic material is Teslan.

13. A magnetic rotary encoder system as defined in claim 1 wherein said encoder wheel is made of a magnetic material.

* * * * *